(12) United States Patent
Kim et al.

(10) Patent No.: US 9,369,144 B2
(45) Date of Patent: Jun. 14, 2016

(54) ANALOG-TO-DIGITAL CONVERTER, IMAGE SENSOR INCLUDING THE SAME, AND IMAGE PROCESSING DEVICE INCLUDING THE IMAGE SENSOR

(71) Applicant: Samsung Electronics Co., Ltd., Suwon-Si, Gyeonggi-Do (KR)

(72) Inventors: Jae Hong Kim, Suwon-si (KR); Yu Jin Park, Seoul (KR); Jin Ho Seo, Seoul (KR); Kwi Sung Yoo, Seoul (KR); Wun Ki Jung, Suwon-si (KR); Han Kook Cho, Suwon-si (KR); Seog Heon Ham, Suwon-si (KR); Min Ji Hwang, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 68 days.

(21) Appl. No.: 14/327,047

(22) Filed: Jul. 9, 2014

(65) Prior Publication Data

US 2015/0022702 A1   Jan. 22, 2015

(30) Foreign Application Priority Data

Jul. 19, 2013   (KR) .......................... 10-2013-0085607

(51) Int. Cl.
*H04N 5/378*   (2011.01)
*H03M 1/12*   (2006.01)
*H03M 1/18*   (2006.01)

(52) U.S. Cl.
CPC ................ *H03M 1/12* (2013.01); *H04N 5/378* (2013.01); *H03M 1/18* (2013.01)

(58) Field of Classification Search
CPC ........ H03M 1/12; H04N 5/378; H04N 5/3745
See application file for complete search history.

(56) References Cited

U.S. PATENT DOCUMENTS

| | | | | |
|---|---|---|---|---|
| 5,514,997 A * | 5/1996 | Quinn | .................. | H03H 19/004 327/266 |
| 6,011,433 A * | 1/2000 | Nairn | ...................... | H03F 3/005 330/2 |
| 6,529,237 B1 * | 3/2003 | Tsay | ...................... | H04N 5/361 348/241 |
| 7,123,301 B1 * | 10/2006 | Nakamura | ................ | H03F 1/14 327/124 |
| 7,242,427 B2 * | 7/2007 | Kokubun | ............... | H04N 5/343 348/230.1 |
| 7,382,408 B2 * | 6/2008 | Rossi | .................. | H04N 5/3537 348/308 |
| 7,508,427 B2 * | 3/2009 | Choi | .................... | G11C 27/026 348/241 |
| 9,118,857 B2 * | 8/2015 | Iwata | .................... | H04N 5/3698 |
| 2002/0176009 A1 * | 11/2002 | Johnson | ................ | H04N 5/335 348/229.1 |
| 2004/0012697 A1 * | 1/2004 | Rossi | .................. | H04N 5/3537 348/308 |
| 2004/0165088 A1 * | 8/2004 | Barna | .................... | H04N 5/378 348/241 |
| 2005/0168601 A1 * | 8/2005 | Lim | ........................ | H03F 3/005 348/241 |
| 2005/0195645 A1 * | 9/2005 | Panicacci | ............. | H04N 5/3575 365/156 |
| 2009/0091387 A1 * | 4/2009 | Cho | ........................ | H03F 3/005 330/254 |
| 2012/0217376 A1 * | 8/2012 | Ackland | .............. | H04N 5/3745 250/208.1 |
| 2013/0135503 A1 * | 5/2013 | Park | ........................ | H03F 1/34 348/308 |

FOREIGN PATENT DOCUMENTS

| | | |
|---|---|---|
| JP | 2005318601 A | 11/2005 |
| JP | 2008177649 A | 7/2008 |
| JP | 2011109352 A | 6/2011 |
| KR | 100722692 B1 | 5/2007 |
| KR | 100748426 B1 | 8/2007 |
| KR | 20110031038 A | 3/2011 |
| KR | 2012000264 A | 1/2012 |

OTHER PUBLICATIONS

S. Kavusi, "Quantitative Study of High Dynamic Range Sigma Delta-based Local Plane Array Architectures", Infrared Technology and Applications XXX, edited by Bjem F. Andresen, Gabor F. Fulop, Proc. of SPIE vol. 5406 (SPIE, Bellingham, WA, 2004) 0277-786X/04/$15 • doi: 10.1117/12.548875, 10pgs.
P. Rombouts, "A Versatile NYQUIST-Rate A/D Converter With 16-18 BIT Performance for Sensor Readout Applications", Elsevier Integration, the VLSI journal 39 (2005) 48-61, 14pgs.
J. De Maeyer, "A Double-Sampling Extended-Counting ADC", IEEE Journal of Solid-State Circuits, vol. 39. No. 3, Mar. 2004, 8pgs.
J, Kim, "A 14B Extended Counting ADC Implemented in a 24MPIXEL a CL\105 Image Sensor", Solid-State Circuits Conference Digest of Technical Papers (ISSCC), 2012 IEEE International Date of Conference: Feb. 19-23, 2012, 2pgs.

* cited by examiner

*Primary Examiner* — Nicholas Giles
(74) *Attorney, Agent, or Firm* — Harness, Dickey & Pierce, P.L.C.

(57) ABSTRACT

An analog-to-digital converter includes a gain amplification unit configured to receive a pixel signal at a first node and to amplify a gain of the pixel signal, a first capacitor connected between the first node and a second node, an amplifier configured to receive and amplify a signal output from the gain amplification unit and the first capacitor, and a conversion circuit configured to convert an output signal of the amplifier to a digital signal based on a reference signal and output the digital signal as a first output signal.

18 Claims, 10 Drawing Sheets

ANALOG-TO-DIGITAL CONVERTER, IMAGE SENSOR INCLUDING THE SAME, AND IMAGE PROCESSING DEVICE INCLUDING THE IMAGE SENSOR

CROSS-REFERENCE TO RELATED APPLICATIONS

This application claims priority under 35 U.S.C. §119(a) from Korean Patent Application No. 10-2013-0085607 filed on Jul. 19, 2013, the disclosure of which is hereby incorporated by reference in its entirety.

BACKGROUND

Example embodiments of inventive concepts relate to an analog-to-digital converter (ADC), such as an ADC for amplifying an input, an image sensor including the same, and/or an image processing device including the image sensor.

An image sensor is a device that converts an optical image signal into an electrical image signal. Sensitivity control is a basic function of the image sensor. Sensitivity is controlled by adjusting the gain of a result of correlated double sampling (CDS) before to perform analog-to-digital conversion of the CDS result. For this operation, the image sensor includes a programmable gain amplifier (PGA) circuit between a CDS circuit and an ADC.

Since the PGA circuit is implemented using a plurality of capacitors, mismatch occurs between the capacitors. Moreover, since an ADC is connected to each of columns in a two-dimensional pixel array of the image sensor, the PGA circuit is provided for each column, which increases an entire area of the image sensor.

SUMMARY

According to some embodiments of the inventive concepts, there is provided an analog-to-digital converter including a gain amplification unit configured to receive a pixel signal at a first node and to amplify a gain of the pixel signal, a first capacitor connected between the first node and a second node, an amplifier configured to receive and amplify a signal output from the gain amplification unit and the first capacitor, and a conversion circuit configured to convert an output signal of the amplifier to a digital signal based on a reference signal and output the digital signal as a first output signal.

The gain amplification unit may include a first switch configured to operate in response to a first gain control signal, a second switch configured to operate in response to a second gain control signal, and a second capacitor configured to amplify the gain of the pixel signal based on the first and second gain control signals.

The second capacitor may be a variable capacitor. A capacitance of the variable capacitor is proportional to a capacitance of the first capacitor and a gain amplification factor for the pixel signal.

Alternatively, the gain amplification unit may include at least one second capacitor having a capacitance proportional to a capacitance of the first capacitor and a gain amplification factor for the pixel signal and at least two switches corresponding to the at least one second capacitor.

The at least one second capacitor may be connected in parallel with the first capacitor between the first node and the second node.

According to another example embodiment of inventive concepts, there is provided an image sensor including a pixel array including a plurality of pixels, a timing controller configured to control an operation of the pixel array and to output at least one control signal for controlling an output of the pixels, and an analog-to-digital converter configured to amplify and perform analog-to-digital conversion on a signal output from the pixels. The analog-to-digital converter includes a gain amplification unit configured to receive a pixel signal from the pixel array through a first node and to amplify a gain of the pixel signal, and the analog-to-digital converter further including a first capacitor connected between the first node and a second node.

The gain amplification unit may include a first switch configured to operate in response to a first gain control signal output from the timing controller, a second switch configured to operate in response to a second gain control signal output from the timing controller, and a second capacitor configured to amplify the gain of the pixel signal based on the first and second gain control signals.

The second capacitor may be a variable capacitor. A capacitance of the variable capacitor is proportional to a capacitance of the first capacitor and a gain amplification factor for the pixel signal.

Alternatively, the gain amplification unit may include at least one second capacitor having a capacitance proportional to a capacitance of the first capacitor and a gain amplification factor for the pixel signal and at least two switches corresponding to each of the at least one second capacitor.

The at least one second capacitor may be connected in parallel with the first capacitor between the first node and the second node.

The analog-to-digital converter may be a delta-sigma analog-to-digital converter.

According to another example embodiment of inventive concepts, there is provided an image processing device including the above-described image sensor and a processor configured to control an operation of the image sensor.

The image processing device may be one of a mobile phone, a tablet personal computer (PC), and a digital single-lens reflex (DSLR) camera.

At least one example embodiment discloses an image processing device including a pixel array configured to produce an image signal and an analog-to-digital converter (ADC) configured to receive an input signal corresponding to the image signal and control a gain of the input signal based on a capacitance of a first capacitor in the ADC, the capacitance of the first capacitor being proportional to a capacitance of a second capacitor and a desired gain amplification factor

BRIEF DESCRIPTION OF THE DRAWINGS

The above and other features and advantages of inventive concepts will become more apparent by describing in detail example embodiments thereof with reference to the attached drawings in which.

DETAILED DESCRIPTION OF EXAMPLE EMBODIMENTS

Figure 1:
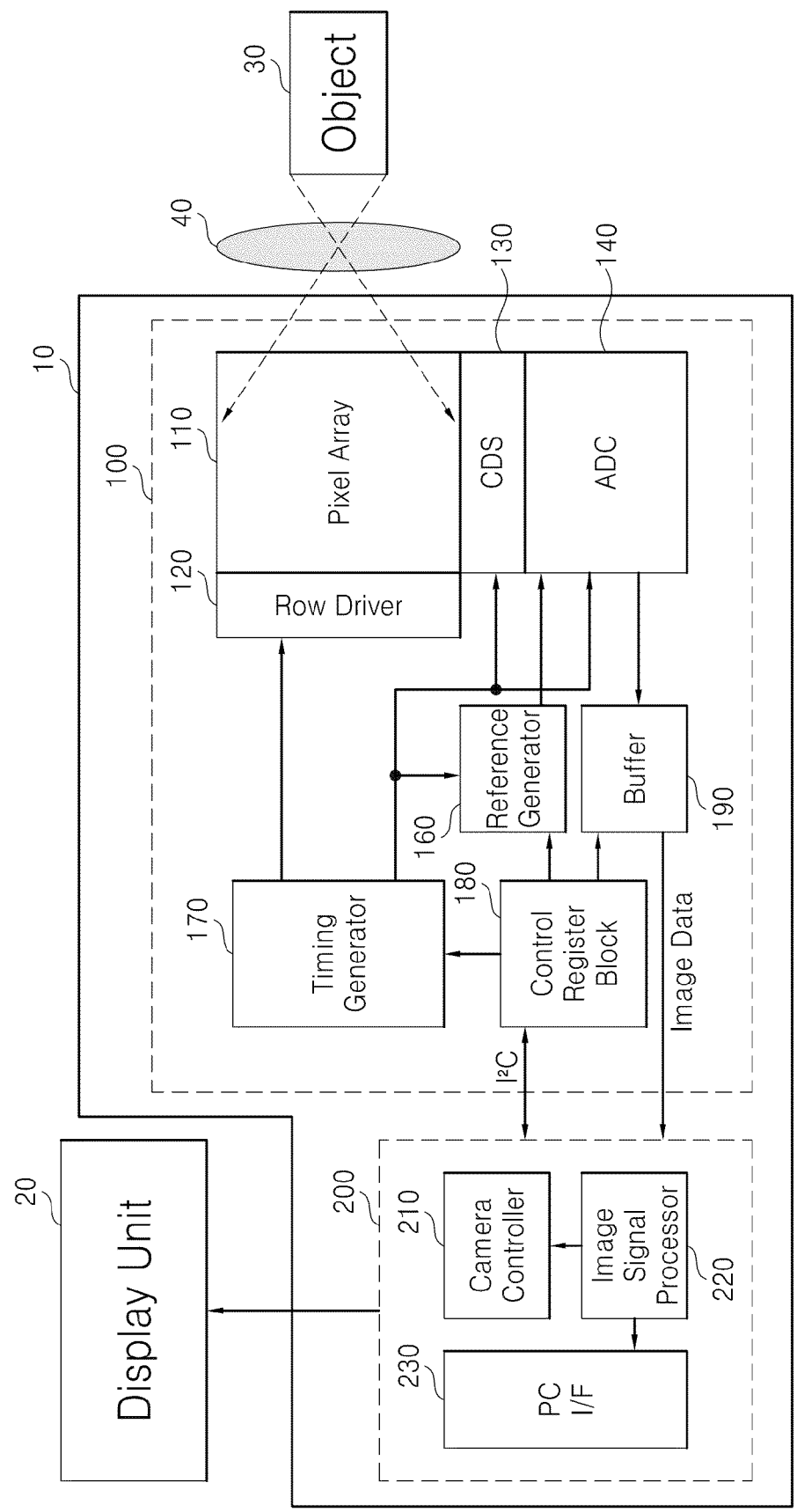
FIG. 1 is a schematic block diagram of an image processing device including an image sensor according to an example embodiment of inventive concepts.

Inventive concepts now will be described more fully hereinafter with reference to the accompanying drawings, in which example embodiments are shown. Example embodiments may, however, be embodied in many different forms and should not be construed as limited to the embodiments set forth herein. Rather, example embodiments are provided so that this disclosure will be thorough and complete, and will fully convey the scope of example embodiments to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of an image processing device 10 including an image sensor 100 according to an example embodiment of inventive concepts. The image processing device 10 includes the image sensor 100 and an image processor 200.

The image processing device 10 may be controlled by the image processor 200 to sense an object 30 captured through a lens 40. The image processor 200 may output an image, which has been sensed and output by the image sensor 100, to a display unit 20. At this time, the display unit 20 may be any device that can output an image. For instance, the display unit 20 may be a computer, a mobile phone, or other image output terminals.

The image processor 200 may include a camera controller 210, an image signal processor 220, and a personal computer interface (PC I/F) 230. The camera controller 210 controls the control register block 180. The camera controller 210 may control the image sensor 100, and more specifically, the control register block 180 using an inter-integrated circuit (I2C), but the scope of inventive concepts is not restricted thereto.

The image signal processor 220 receives image data, i.e., an output signal of a buffer 190, processes the image data into a viewable image, and outputs the image to the display unit 20 through the PC I/F 230. Although the image signal processor 220 is positioned within the image processor 200 in FIG. 1, the position of the image signal processor 220 may be changed. The image signal processor 220 may be positioned within the image sensor 100 in other example embodiments.

The image sensor 100 includes a pixel array 110, a row driver 120, a correlated double sampling (CDS) circuit 130, an analog-to-digital converter (ADC) 140, a reference generator 160, a timing generator 170, the control register block 180, and the buffer 190. The pixel array 110 includes a plurality of photo sensitive devices such as photo diodes or pinned photo diodes. The pixel array 110 senses light using the photo sensitive devices and converts the light into an electrical signal to generate an image signal.

The timing generator 170 may output a control signal to the row driver 120, the CDS circuit 130, the ADC 140, and the reference generator 160 to control the operations of these elements 120, 130, 140, and 160. The control register block 180 may output a control signal to the reference generator 160, the timing generator 170, and the buffer 190 to control the operations of the elements 160, 170, and 190. The control register block 180 is controlled by the camera controller 210. The camera controller 210 may be implemented in hardware or software.

The row driver 120 drives the pixel array 110 in units of rows. For instance, the row driver 120 may generate a row selection signal. In detail, the row driver 120 may decode a row control signal (e.g., an address signal) generated by the timing generator 170 and may select one of the rows in the pixel array 110 in response to the decoded row control signal. The pixel array 110 outputs to the CDS circuit 130 a reset signal and an image signal from the row selected by the row selection signal received from the row driver 120.

The CDS circuit 130 may perform CDS on the reset signal and the image signal. The ADC 140 outputs a result signal using reference signals received from the reference generator 160 and a CDS signal output from the CDS circuit 130, counts the result signal, and outputs a count result to the buffer 190. The ADC 140 may include at least one block that performs analog-to-digital conversion in a single stage or at least two stages. The ADC 140 may amplify input signals and then perform the analog-to-digital conversion on the input signals.

The buffer 190 temporarily stores a digital signal output from the ADC 140 and senses and amplifies the digital signal before outputting it. The buffer 190 may include a plurality of column memory blocks, e.g., static random access memories (SRAMs), provided for respective columns for temporal storing of the digital signal; and a sense amplifier which senses and amplifies the digital signal output from the ADC 140.

Figure 2:
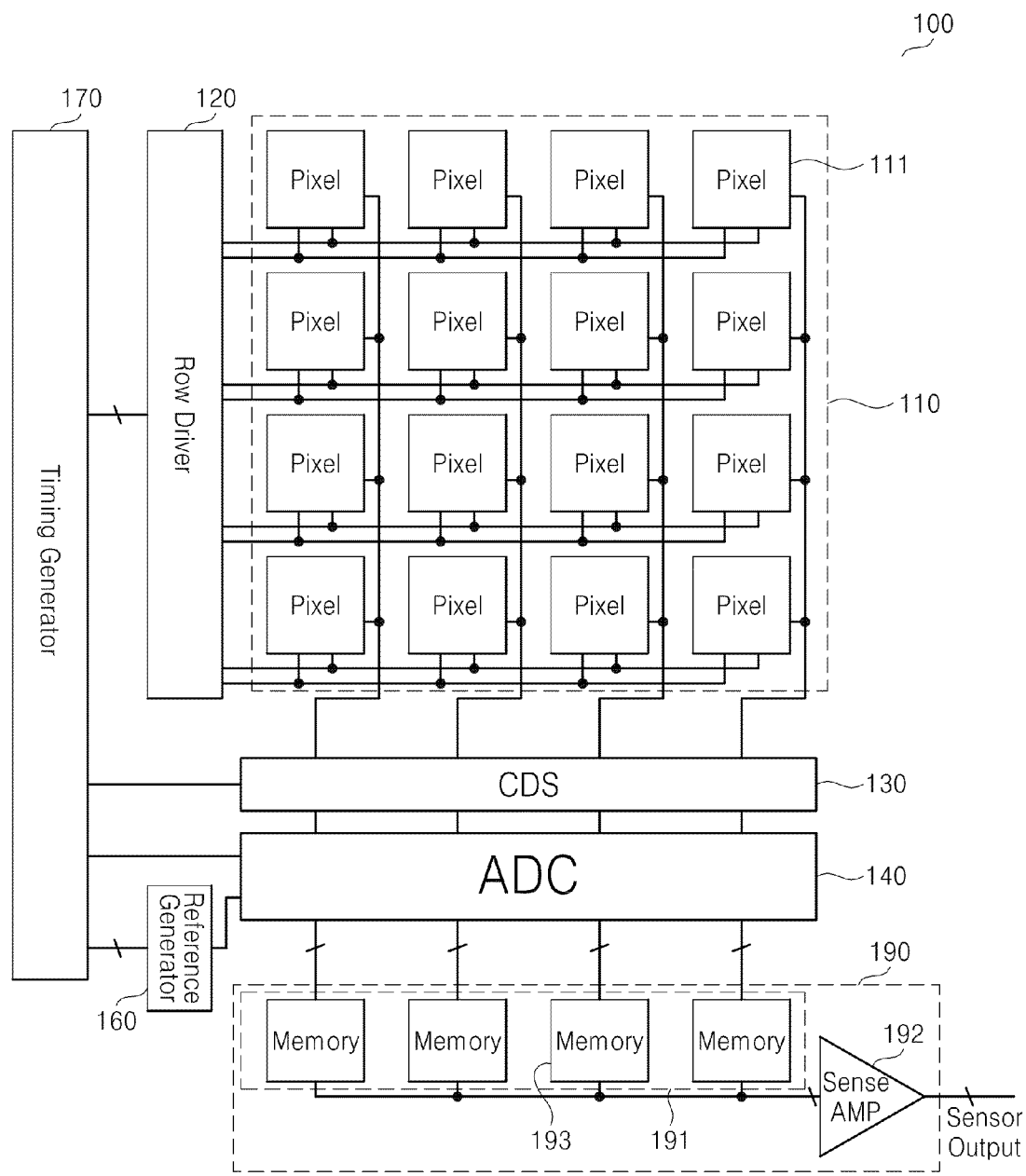
FIG. 2 is a detailed block diagram of the image sensor illustrated in FIG. 1.

FIG. 2 is a detailed block diagram of the image sensor 100 illustrated in FIG. 1. Referring to FIG. 2, the image sensor 100 includes the pixel array 110, the row driver 120, the CDS circuit 130, the ADC 140, the reference generator 160, the timing generator 170, and the buffer 190.

The pixel array 110 includes a plurality of pixels 111 arranged in a matrix form, each of which is connected to one of a plurality of row lines and one of a plurality of column lines. Each of the pixels 111 may include a red filter which passes light in the red spectrum, a green filter which passes light in the green spectrum, and a blue filter which passes light in the blue spectrum. According to another example embodiment of inventive concepts, each of the pixels 111 may include a cyan filter, a magenta filter, and a yellow filter.

The row driver 120 may decode a row control signal (e.g., an address signal) generated by the timing generator 170 and select at least one row line from among the row lines included in the pixel array 110 in response to a decoded row control signal.

The CDS circuit 130 may perform CDS on a pixel signal output from a pixel 111 connected to one of the column lines in the pixel array 110. The ADC 140 may output a result signal using reference signals received from the reference generator 160 and a CDS signal received from the CDS circuit 130, count the result signal, and output a count result to the buffer 190. The reference generator 160 may operate based on a control signal generated by the timing generator 170.

The buffer 190 includes a column memory block 191 and a sense amplifier 192. The column memory block 191 includes a plurality of memories 193.

Each memory 193 may operate in response to a memory control signal generated by a memory controller (not shown) positioned within the column memory block 191 or the timing generator 170 based on a control signal generated by the timing generator 170. The memory 193 may be implemented as SRAM.

In response to the memory control signal, the column memory block 191 receives and stores a digital signal output from the ADC 140. Digital signals stored in the respective memories 193 are amplified by the sense amplifier 192 and output as image data.

Figure 3:
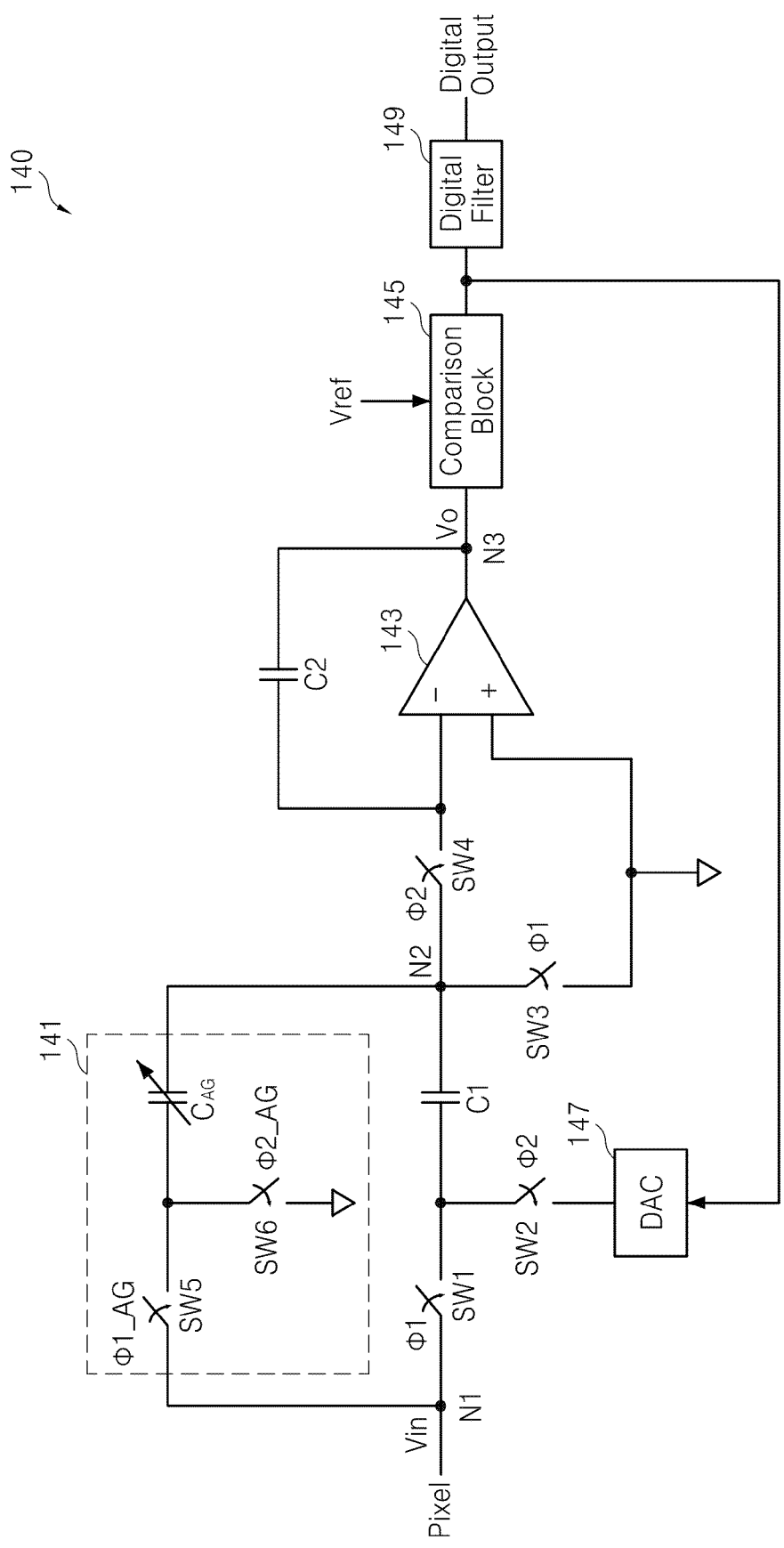
FIG. 3 is a block diagram of an analog-to-digital converter (ADC) according to an example embodiment of inventive concepts.
Figure 4:
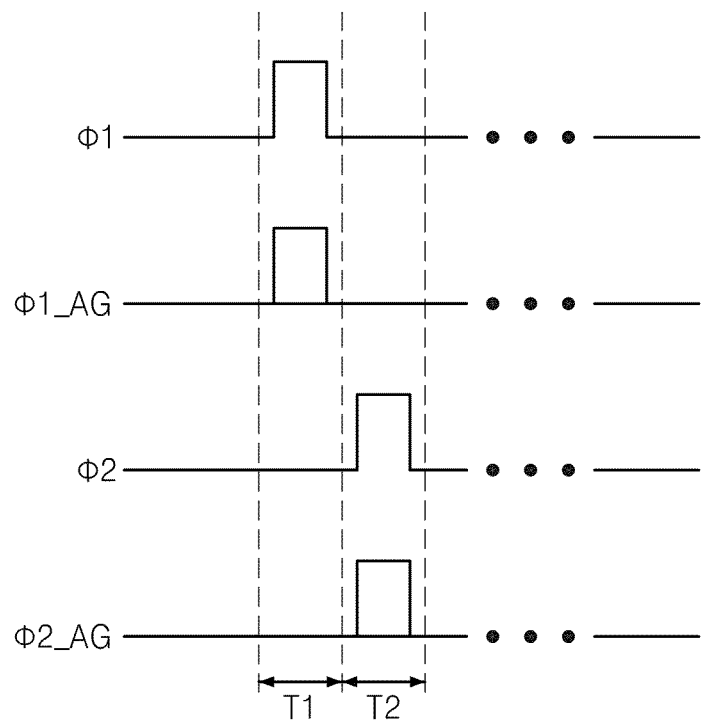
FIG. 4 is a diagram illustrating control signals to explain the operation of the ADC illustrated in FIG. 3.
Figure 5A:
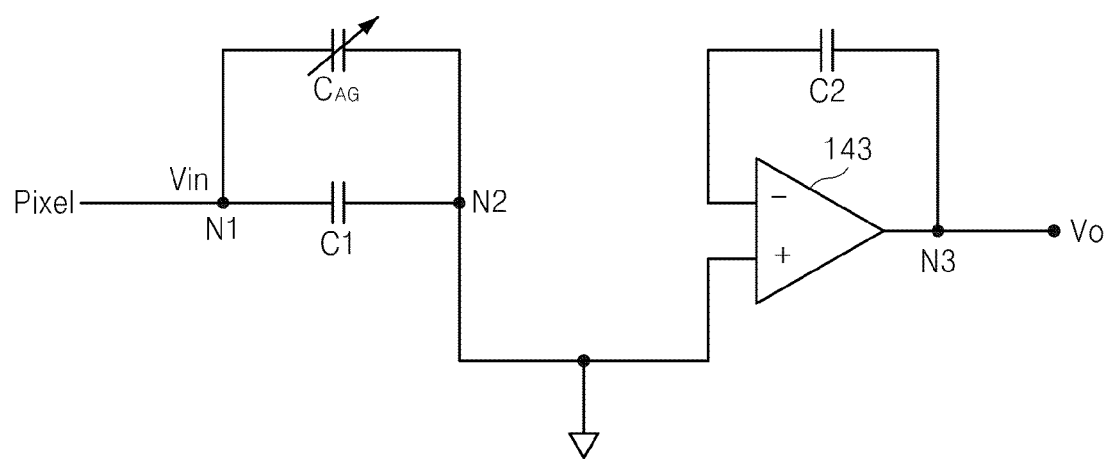
FIGS. 5A and 5B are diagrams for explaining the operation of the ADC using the control signals illustrated in FIG. 4.
Figure 5B:
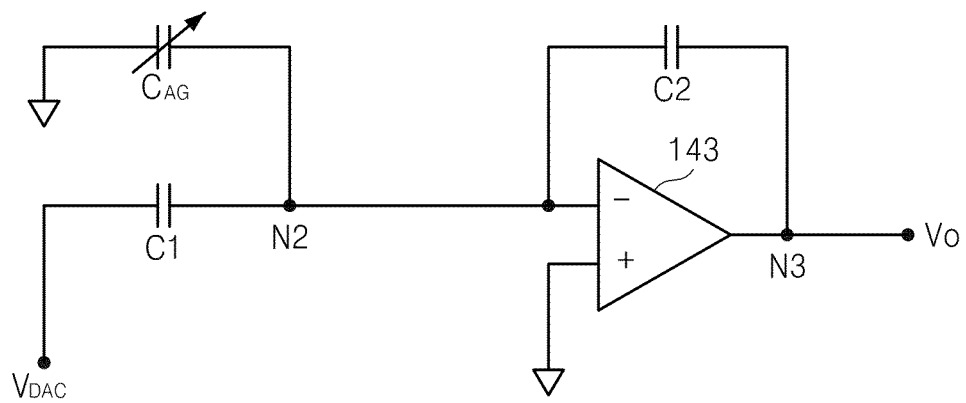

FIG. 3 is a block diagram of the ADC 140 according to an example embodiment of inventive concepts. FIG. 4 is a diagram illustrating control signals to explain the operation of the ADC 140 illustrated in FIG. 3. FIGS. 5A and 5B are diagrams for explaining the operation of the ADC 140 using the control signals illustrated in FIG. 4.

Referring to FIGS. 1 through 3, the ADC 140 includes a gain amplification unit 141, an amplifier 143, a comparison block 145, a digital-to-analog converter (DAC) 147, and a digital filter 149. A first node N1, the amplifier 143, the comparison block 145, and DAC 147 are connected with one another through first through fourth switches SW1 through SW4 and first and second capacitors C1 and C2. The first and third switches SW1 and SW3 are controlled by a first control signal $\Phi 1$ and the second and fourth switches SW2 and SW4 are controlled by a second control signal $\Phi 2$.

The gain amplification unit 141 receives a pixel signal, which is output from the pixel array 110 through a column line, through the first node N1 and amplifies the gain of the pixel signal. For this operation, the gain amplification unit 141 may include a fifth switch SW5, a sixth switch SW6, and a third capacitor $C_{AG}$.

The third capacitor $C_{AG}$ may be implemented as a variable capacitor, but inventive concepts are not restricted to example embodiments. In other example embodiments, the gain amplification unit 141 may include at least one capacitor and at least two switches corresponding to the capacitor. For instance, the gain amplification unit 141 may include one capacitor and two switches when it amplifies an input signal Vin two-fold and it may include two capacitors and four switches when it amplifies the input signal Vin four-fold. At this time, the capacitors may be connected in parallel with the first capacitor C1 between the first node N1 and a second node N2.

The fifth switch SW5 is controlled by a first gain control signal $\Phi 1\_AG$ and the sixth switch SW6 is controlled by a second gain control signal $\Phi 2\_AG$. The first control signal $\Phi 1$, the second control signal $\Phi 2$, the first gain control signal $\Phi 1\_AG$, and the second gain control signal $\Phi 2\_AG$ may be generated by, the timing generator 170.

A procedure in which the ADC 140 operates according to signals received from the timing generator 170 is illustrated in FIG. 4 and FIGS. 5A and 5B. Referring to FIG. 4 and FIGS. 5A and 5B, the first control signal $\Phi 1$ is at a high level and the second control signal $\Phi 2$ is at a low level in a first period T1. At this time, when the gain of a pixel signal is amplified, the first control signal $\Phi 1$ and the first gain control signal $\Phi 1\_AG$ are simultaneously enabled. The first control signal $\Phi 1$ is at a low level and the second control signal $\Phi 2$ is at a high level in a second period T2. At this time, when the gain of a pixel signal is amplified, the second control signal $\Phi 2$ and the second gain control signal $\Phi 2\_AG$ are simultaneously enabled.

When the first control signal $\Phi 1$ and the first gain control signal $\Phi 1\_AG$ are at a high level, the ADC 140 may be configured as shown in FIG. 5A. Referring to FIG. 5A, the first, third, and fifth switches SW1, SW3, and SW5 are closed, and therefore, the first and third capacitors C1 and $C_{AG}$ are charged with the input signal Vin, i.e., a pixel signal received from the pixel array 110.

Thereafter, when the second control signal $\Phi 2$ and the second gain control signal $\Phi 2\_AG$ are at a high level, the ADC 140 may be configured as shown in FIG. 5B. Referring to FIG. 5B, the second, fourth, and sixth switches SW2, SW4, and SW6 are closed, and therefore, the circuit illustrated in FIG. 5B operates as an integrator.

At this time, an output $V_O$ of a third node N3 is defined as Equation 1:

$$V_O = \frac{C1}{C2}(Vin - V_{DAC}) + \frac{C_{AG}}{C2}Vin. \tag{1}$$

The capacitance of the third capacitor $C_{AG}$ at a gain amplification factor N (where N is a natural number) to be adjusted is defined as Equation 2:

$$C_{AG} = C1(N-1) \tag{2}$$

When Equation 1 is simplified using Equation 2, Equation 3 is obtained:

$$V_O = \frac{C1}{C2}(N*Vin) - \frac{C1}{C2}V_{DAC}. \tag{3}$$

According to Equation 3, the input signal Vin is amplified N-fold. Meanwhile, the third capacitor $C_{AG}$ amplifies the gain of the input signal Vin based on a ratio of the capacitance of the third capacitor $C_{AG}$ to the capacitance of the first capacitor C1. For this operation, the capacitance of the third capacitor $C_{AG}$ may be changed according to its ratio to the capacitance of the first capacitor C1 with respect to the gain amplification factor N. Consequently, the ADC 140 controls the gain of the input signal Vin using the third capacitor $C_{AG}$, so that the input signal Vin is amplified N-fold before being output.

Referring back to FIG. 3, the comparison block 145 converts the voltage $V_O$ received from the amplifier 143 through the third node N3 into a digital value based on a reference voltage Vref output from the reference generator 160. The DAC 147 converts the digital value received from the comparison block 145 into an analog signal $V_{DAC}$. The digital filter 149 may perform a cumulative calculation on the digital value output from the comparison block 145. At this time, the digital filter 149 may perform the cumulative calculation on the digital value according to a number of clocks which is in accordance with the number of bits of ADC resolution.

Figure 6:
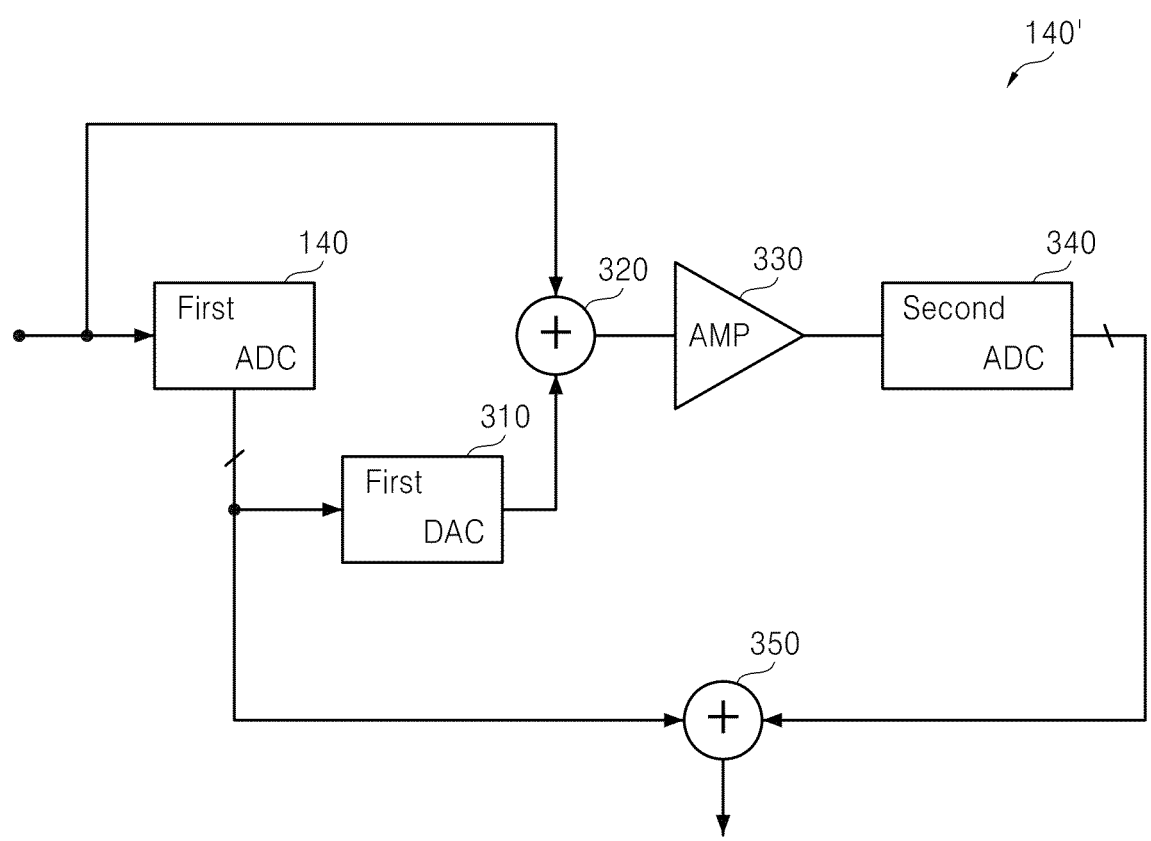
FIG. 6 is a block diagram of an ADC according to another example embodiment of inventive concepts.

FIG. 6 is a block diagram of an ADC 140' according to another example embodiment of inventive concepts. The ADC 140' may be an extended ADC (EC-ADC) 140' that performs analog-to-digital conversion in at least two stages. Referring to FIG. 6, the EC-ADC 140' includes the first ADC 140, a first DAC 310, a first adder 320, an amplifier 330, a second ADC 340, and a second adder 350.

The first ADC 140 has the same structure as the ADC 140 illustrated in FIG. 3 and may be implemented as a delta-sigma ADC. The second ADC 340 may be implemented as a cyclic ADC, a successive approximation register (SAR) ADC, or a single slope ADC, but inventive concepts are not restricted to these examples. The first ADC 140 may receive a signal output from the pixel array 110, convert the signal into a digital signal, and output the digital signal to the first DAC 310. The first DAC 310 may convert the digital signal received from the first ADC 140 to an analog signal and output the analog signal to the first adder 320.

The first adder 320 adds the signal output from the first DAC 310 and the signal output from the pixel array 110 and outputs an addition result to the amplifier 330. The amplifier 330 amplifies the addition result and outputs an amplified signal to the second ADC 340. The second ADC 340 converts the output signal of the amplifier 330 to a digital signal.

The second adder 350 adds the digital signal output from the first ADC 140 and the digital signal output from the second ADC 340 and outputs an addition result as an output signal. For instance, when the first ADC 140 is an L-bit ADC and outputs a signal value of X and the second ADC 340 is an M-bit ADC and outputs a signal value of Y, the second adder 350 may calculate an output value as $2^L \times X + Y$.

Although the two-stage EC-ADC 140' including two ADCs 140 and 340 has been described in FIG. 6, inventive concepts are not restricted thereto. An EC-ADC may include at least two ADCs in other example embodiments. At this time, the ADC 140 illustrated in FIG. 3 may be provided at a first stage.

Figure 7:
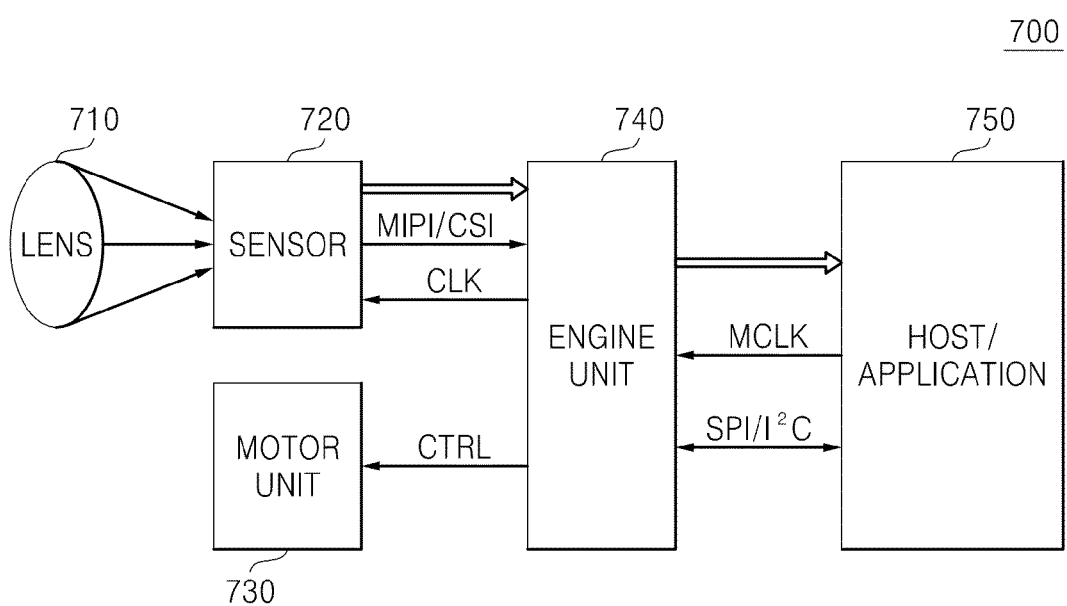
FIG. 7 is a block diagram of a camera system according to an example embodiment of inventive concepts.

FIG. 7 is a block diagram of a camera system 700 according to an example embodiment of inventive concepts. The camera system 700 may be a digital camera.

Referring to FIG. 7, the camera system 700 may include a lens 710, an image sensor 720, a motor unit 730, and an engine unit 740. The image sensor 100 illustrated in FIGS. 1 through 6 may be used as the image sensor 720.

The lens 710 focuses incident light onto a light receiving area (e.g., a photodiode) in the image sensor 720. The image sensor 720 generates image data based on the incident light received through the lens 710. The image sensor 720 may provide the image data based on a clock signal CLK. The image sensor 720 may interface with the engine unit 740 using a mobile industry processor interface (MIPI) and/or a camera serial interface (CSI). The motor unit 730 may adjust the focus of the lens 710 in response to a control signal CTRL received from the engine unit 740 or may perform shuttering. The engine unit 740 controls the image sensor 720 and the motor unit 730. The engine unit 740 may generate YUV data, which includes a distance to an object, a luminance component, a difference between the luminance component and a blue component, and a difference between the luminance component and a red component, based on distance and/or image data received from the image sensor 720, or may generate compressed data, e.g., Joint Photography Experts Group (JPEG) data. The engine unit 740 may be connected to a host/application 750 and may provide the YUV data or JPEG data to the host/application 750 based on a master clock signal MCLK. In addition, the engine unit 740 may interface with the host/application 750 using a serial peripheral interface (SPI) and/or an inter integrated circuit ($I^2C$).

Figure 8:
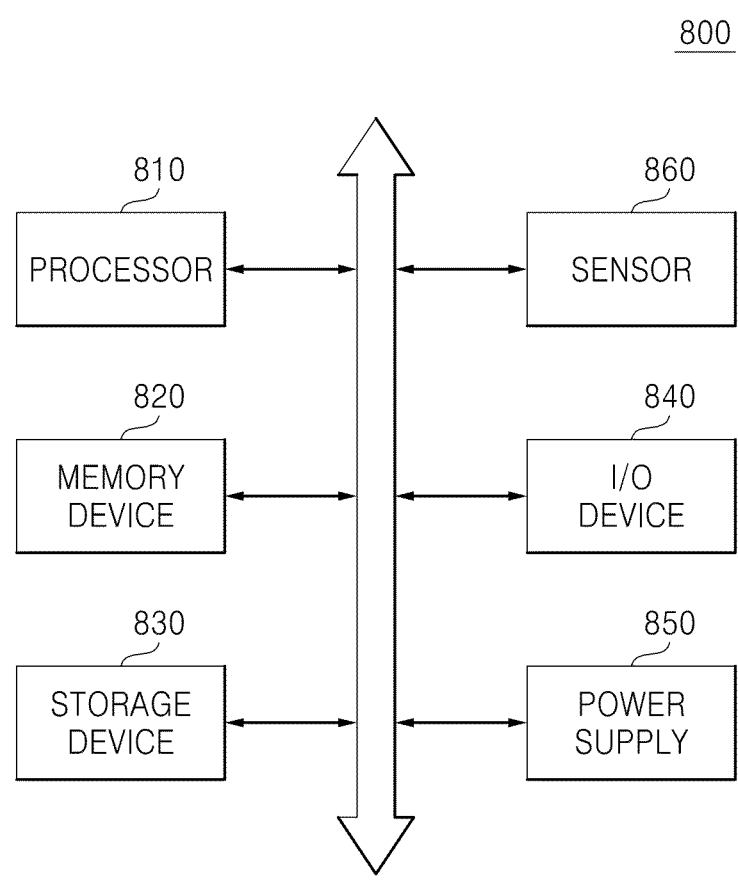
FIG. 8 is a block diagram of computing system according to an example embodiment of inventive concepts.

FIG. 8 is a block diagram of computing system according to an example embodiment of inventive concepts. Referring FIG. 8, the computing system 800 may include a processor 810, a memory device 820, a storage device 830, an input/output ((I/O) device 840, a power supply 850 and an image sensor 860.

The image sensor 860 may be the image sensor 100 illustrated in FIG. 1. Even though not shown in FIG. 8, the computing system 800 may further include ports that can communicate with a video card, a sound card, a memory card, a USB device or another electronic device.

The processor 810 may perform particular calculations or tasks. According to an example embodiment, the processor 810 may include a micro-processor or a central processing unit. The processor 810 may communicate with the memory device 820, the storage device 830 and the I/O device 840 via an address bus, a control bus, and a data bus.

According to some embodiments, the processor 810 may connect with an expansion bus such as PCI (Peripheral Component Interconnect) bus.

The memory device 820 may store data needed for operations of the computing system 800. For example, the memory device 820 may be implemented as a dynamic random access memory (DRAM), a mobile DRAM, a static random access memory (SRAM), a phase-change RAM (PRAM), a ferroelectric RAM (FRAM), a resistive RAM (RRAM or ReRAM), and/or a magnetic RAM (MRAM).

The storage device 830 may include a solid state drive (SSD), a hard disk drive (HDD), and/or a compact disk-read only memory (CD-ROM).

The I/O device 840 may include an input device such as a keyboard, a keypad, or a computer mouse, and an output device such as a printer or a display.

The power supply 850 may provide operation voltage needed for operation of the computing system 800.

The image sensor 860 may be connected to and communicate with the processor 810 via the buses or other communication links. The image sensor 860 may be implemented as one chip with the processor 810 or as a separate chip.

The computing system 800 may be any one of all kind of computing systems using the image sensor 860. For example, the computing system 800 may include a digital camera, a cellular phone, a personal digital assistant (PDA), a portable multimedia player (PMP), or a smart phone.

Figure 9:
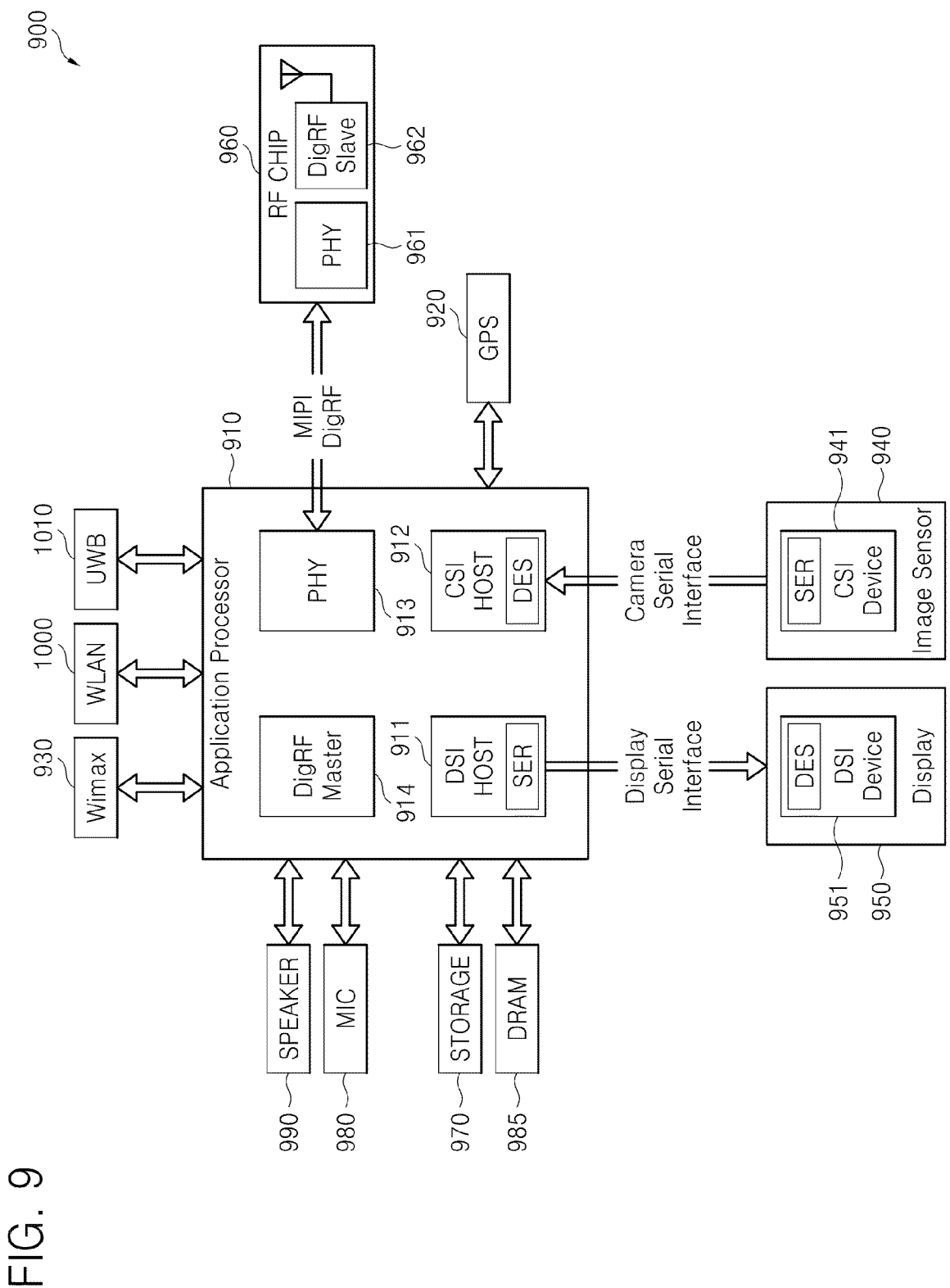
FIG. 9 is a block diagram of interfaces used in the computing system illustrated in FIG. 8.

FIG. 9 is a block diagram of interfaces used in the computing system illustrated in FIG. 8. The computing system 900 may be implemented by a data processing apparatus that can use or support the MIPI interface. The computing system 900 may include an application processor 910, an image sensor 940, and a display 950.

A camera serial interface (CSI) host 912 included in the application processor 910 performs serial communication with a CSI device 941 included in the image sensor 940 through CSI. For example, an optical de-serializer (DES) may be implemented in the CSI host 912, and an optical serializer (SER) may be implemented in the CSI device 941. The image sensor 940 may be the image sensor 100 illustrated in FIGS. 1 through 6.

A display serial interface (DSI) host 911 included in the application processor 910 performs serial communication with a DSI device 951 included in the display 950 through DSI. For example, an optical serializer may be implemented in the DSI host 911, and an optical de-serializer may be implemented in the DSI device 951.

The computing system 900 may also include a radio frequency (RF) chip 960 which communicates with the application processor 910. A physical layer (PHY) 913 of the computing system 900 and a PHY 961 of the RF chip 960 communicate data with each other according to a MIPI DigRF standard. The application processor 910 may further include a DigRF master 914 controlling data transmission according to a MIPI DigRF of PHY 913.

The computing system 900 may further include a global positioning system (GPS) 920, a storage device 970, a microphone 980, a DRAM 985 and a speaker 990. The computing system 900 may communicate using UWB (Ultra Wideband) 1010, WLAN (Wireless Local Area Network) 1000, and Wimax (Worldwide Interoperability for Microwave Access) 930, etc. However, the structure and interface of the computing system 900 is not restricted there-to.

As described above, according to example embodiments of inventive concepts, an ADC amplifies an input signal without requiring a separate programmable gain amplifier (PGA) circuit, thereby reducing noise and obtaining high gain.

While inventive concepts has been particularly shown and described with reference to example embodiments thereof, it will be understood by those of ordinary skill in the art that various changes in forms and details may be made therein without departing from the spirit and scope of inventive concepts as defined by the following claims.

What is claimed is:

1. An analog-to-digital converter comprising:
    a gain amplification unit configured to receive a pixel signal at a first node during a first time period, the gain amplification unit configured to amplify a gain of the pixel signal;
    a first capacitor connected between the first node and a second node during the first time period;
    an amplifier configured to receive and amplify a signal output from the gain amplification unit and the first capacitor;
    a conversion circuit configured to convert an output signal of the amplifier to a digital signal based on a reference signal and output the digital signal as a first output signal; and
    a digital-to-analog converter configured to convert the first output signal to an analog signal, the first capacitor connected between the digital-to-analog converter and the second node during a second time period and configured to receive the analog signal during the second period.

2. The analog-to-digital converter of claim 1, wherein the gain amplification unit comprises:
    a first switch configured to operate in response to a first gain control signal;
    a second switch configured to operate in response to a second gain control signal; and
    a second capacitor configured to amplify the gain of the pixel signal based on the first and second gain control signals.

3. The analog-to-digital converter of claim 2, wherein the second capacitor is a variable capacitor and a capacitance of the variable capacitor is proportional to a capacitance of the first capacitor and a gain amplification factor for the pixel signal.

4. The analog-to-digital converter of claim 1, wherein the gain amplification unit comprises:
    at least one second capacitor having a capacitance proportional to a capacitance of the first capacitor and a gain amplification factor for the pixel signal; and
    at least two switches corresponding to the at least one second capacitor.

5. The analog-to-digital converter of claim 4, wherein the at least one second capacitor is connected in parallel with the first capacitor between the first node and the second node during the first time period.

6. An image sensor comprising:
    a pixel array including a plurality of pixels;
    a timing controller configured to control an operation of the pixel array and to output at least one control signal for controlling an output of the pixels; and
    an analog-to-digital converter configured to amplify and perform analog-to-digital conversion on a signal output from the pixels, the analog-to-digital converter including,
        a gain amplification unit configured to receive a pixel signal from the pixel array through a first node during a first time period, the gain amplification unit configured to amplify a gain of the pixel signal, and
        a first capacitor connected between the first node and a second node during the first time period, and the first capacitor connected to an analog feedback of the analog-to-digital converter during a second period and connected to the second node during the second period.

7. The image sensor of claim 6, wherein the gain amplification unit comprises:
    a first switch configured to operate in response to a first gain control signal output from the timing controller;
    a second switch configured to operate in response to a second gain control signal output from the timing controller; and
    a second capacitor configured to amplify the gain of the pixel signal based on the first and second gain control signals.

8. The image sensor of claim 7, wherein the second capacitor is a variable capacitor and a capacitance of the variable capacitor is proportional to a capacitance of the first capacitor and a gain amplification factor for the pixel signal.

9. The image sensor of claim 6, wherein the gain amplification unit comprises:
    at least one second capacitor having a capacitance proportional to a capacitance of the first capacitor and a gain amplification factor for the pixel signal; and
    at least two switches corresponding to the at least one second capacitor.

10. The image sensor of claim 9, wherein the at least one second capacitor is connected in parallel with the first capacitor between the first node and the second node during the first time period.

11. The image sensor of claim 6, wherein the analog-to-digital converter is a delta-sigma analog-to-digital converter.

12. An image processing device comprising:
the image sensor of claim 6; and
a processor configured to control an operation of the image sensor.

13. The image processing device of claim 12, wherein the image processing device is one of a mobile phone, a tablet personal computer (PC), and a digital single-lens reflex (DSLR) camera.

14. An image processing device comprising:
a pixel array configured to produce an image signal; and
an analog-to-digital converter (ADC) configured to receive an input signal corresponding to the image signal and control a gain of the input signal based on a capacitance of a first capacitor in the ADC, the capacitance of the first capacitor being proportional to a capacitance of a second capacitor and a desired gain amplification factor, wherein the ADC is configured to charge the first and second capacitors during a first time period by connecting the first and second capacitors to a first node and operate as an integrator during a second time period by connecting the first capacitor to a ground voltage supply and connecting the second capacitor to an analog feedback of the ADC.

15. The image processing device of claim 14, further comprising:
a correlated double sampling (CDS) circuit directly connected to the ADC.

16. The image processing device of claim 14, wherein the first and second capacitors are connected at a common node.

17. The image sensor of claim 6, wherein the analog-to-digital converter further includes:
an amplifier configured to receive and amplify a signal output from the gain amplification unit and the first capacitor;
a conversion circuit configured to convert an output signal of the amplifier to a digital signal based on a reference signal and output the digital signal as a first output signal; and
a digital-to-analog converter configured to convert the first output signal to an analog signal, the first capacitor connected between the digital-to-analog converter and the second node during the second time period and configured to receive the analog signal during the second time period.

18. The image processing device of claim 14, wherein the analog-to-digital converter comprises:
a gain amplification unit configured to receive the input signal from the pixel array through the first node during the first time period, the gain amplification unit configured to amplify the gain of the input signal;
an amplifier configured to receive and amplify a signal output from the gain amplification unit and the second capacitor;
a conversion circuit configured to convert an output signal of the amplifier to a digital signal based on a reference signal and output the digital signal as a first output signal; and
a digital-to-analog converter configured to convert the first output signal to an analog signal, the first capacitor connected between the digital-to-analog converter and a second node during the second time period and configured to receive the analog signal during the second time period.

* * * * *